(12) United States Patent
Mehta et al.

(10) Patent No.: US 6,716,705 B1
(45) Date of Patent: Apr. 6, 2004

(54) EEPROM DEVICE HAVING A RETROGRADE PROGRAM JUNCTION REGION AND PROCESS FOR FABRICATING THE DEVICE

(75) Inventors: Sunil D. Mehta, San Jose, CA (US); Guoxin Li, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/161,283

(22) Filed: Jun. 3, 2002

(51) Int. Cl.[7] ............................................. H01L 21/336
(52) U.S. Cl. ........................ 438/266; 438/264; 438/770
(58) Field of Search ................................ 438/257, 263, 438/264, 266, 766, 770, 795, 981

(56) References Cited

U.S. PATENT DOCUMENTS

| | | | |
|---|---|---|---|
| 5,672,521 A | * | 9/1997 | Barsan et al. ............... 438/276 |
| 5,750,428 A | * | 5/1998 | Chang ........................ 438/264 |
| 5,904,575 A | * | 5/1999 | Ishida et al. ................ 438/770 |
| 5,942,780 A | * | 8/1999 | Barsan et al. ............... 257/321 |
| 6,040,019 A | * | 3/2000 | Ishida et al. ................ 427/526 |

\* cited by examiner

*Primary Examiner*—David Nhu
(74) *Attorney, Agent, or Firm*—Brinks Hofer Gilson & Lione

(57) ABSTRACT

An EEPROM device and process for fabricating the device having a retrograde program junction region includes providing a semiconductor substrate having a principal surface and forming a program junction region in the semiconductor substrate. The program junction region is characterized by a doping concentration profile in which a maximum doping concentration is displaced away from the principal surface. The doping concentration profile can be obtained by forming a first portion of a tunnel dielectric layer on the principal surface, then introducing doping atoms into the program junction region, followed by forming a second portion of a tunnel dielectric layer. In another embodiment, the doping concentration profile in the program junction region is formed by two consecutive doping processes, in which either the same doping species is introduced at different energies, or a second doping process is carried out with a dopant having a different conductivity type than the first dopant.

20 Claims, 5 Drawing Sheets

EEPROM DEVICE HAVING A RETROGRADE PROGRAM JUNCTION REGION AND PROCESS FOR FABRICATING THE DEVICE

TECHNICAL FIELD

The present invention relates, generally, to EEPROM devices and methods for their fabrication and, more particularly, to single-poly EEPROM devices and to methods for their fabrication

BACKGROUND

Non-volatile memory devices are both electrically erasable and programmable. Such devices retain data even after the power to the device is terminated. One particular type of non-volatile memory device is the (electrically-erasable-programmable-read-only-memory) EEPROM device. In a flash EEPROM device, programming and erasing is accomplished by transferring electrons to and from a floating-gate electrode through a thin dielectric layer, known as a tunnel-oxide layer, located between the floating-gate electrode and the underlying substrate. Typically, the electron transfer is carried out either by hot electron injection, or by Fowler-Nordheim tunneling. In either electron transfer mechanism, a voltage is coupled to the floating-gate electrode by a control-gate electrode that may be formed in a region of the substrate referred to in the art as a control-gate region. The control-gate region is capacitively coupled to the floating-gate electrode, such that a voltage applied to the control-gate electrode is coupled to the floating-gate electrode.

EEPROM cells are extensively used in programmable logic devices (PLDs). EEPROM cells used in PLDs can have a two transistor design or a three transistor design. A three transistor EEPROM cell, for example, includes a write transistor, a read transistor, and a sense transistor. In a two transistor device, the functions of read and sense transistors are combined into a single transistor. To program PLD EEPROMs, a high voltage $V_{pp}+$ is applied to the gate electrode of the write transistor and a relatively low voltage $V_{pp}$ is applied to the drain (bitline contact) of the write transistor. The voltage applied to the write transistor gate electrode turns the write transistor on allowing the voltage applied to the bitline to be transferred to the source of the write transistor. Electrons on the floating-gate electrode are drawn from the 5 floating-gate electrode to the source of the write transistor, leaving the floating-gate electrode at a high positive potential. The application of such high voltage levels is a write condition that results in a net positive charge being stored in the EEPROM cell.

To erase the EEPROM cell, a voltage $V_{cc}$ is applied to the gate of the write transistor and ground potential is applied to the bitline and a high voltage $V_{pp}+$ is applied to the control-gate. Under this bias condition, the high voltage applied to control-gate is coupled to the floating-gate electrode and the EEPROM cell is erased by the transfer of electrons from the substrate to the floating-gate electrode.

As PLD EEPROM devices are scaled to smaller dimensions, the junction depth of the program junction region must be reduced. As used herein, the term "program junction region" refers to a highly doped junction region in the substrate underlying the tunnel region and the control gate region. The program junction region is also known by various terms, such as the tunneling implant region. The most straightforward way to do reduce the depth of the program junction region is to simply reduce the doping concentration in the program junction region. Reducing the doping concentration in the program junction region, however, increases the depletion level during operation of the device. Large depletion levels, in turn, reduce the capacitive coupling to the floating gate electrode.

The reduction in capacitive coupling can be compensated for by increasing the capacitor area, but this can result in a larger EEPROM memory cell. Thus, maintaining a controlled amount of depletion in the program junction region, while avoiding increasing the capacitor area, requires that the doping concentration in the program junction region be kept at a high level. A high doping concentration, however, functions to undesirably increase the thickness of the capacitor dielectric layer during thermal oxidation processes used for device fabrication. A high surface doping concentration in the program junction region also causes low Fowler-Nordheim tunneling efficiency, which results in low programming current.

Accordingly, a need exists for an EEPROM device fabrication process that enables the fabrication of shallow junction devices, while maintaining uniform dielectric layer thickness and low surface doping concentration levels.

SUMMARY

The present invention provides a process for fabricating an EEPROM device having a highly-doped shallow-junction program junction region with a retrograde doping concentration profile. The formation of a retrograde doping profile in the program junction region moves the peak doping concentration away from the substrate surface resulting in a relatively low surface doping concentration, while maintaining an overall high doping concentration in the program junction region. The relatively low surface doping concentration enables high programming efficiency by producing a large programming current. Additionally, the retrograde doping profile reduces the program junction threshold voltage and improves the capacitive coupling of the program junction region with an overlying floating-gate layer.

In accordance with the invention there is provided a process for fabricating an EEPROM device that includes providing a semiconductor substrate having a principal surface. A program junction region is formed in the semiconductor substrate that is characterized by doping concentration profile in which a maximum doping concentration is displaced away from the principal surface.

In another aspect of the invention, a process for fabricating a program junction region in an EEPROM device includes providing a semiconductor substrate having a principal surface and forming a first portion of a tunnel dielectric layer overlying the principal surface. Doping atoms are introduced into a tunnel region of the substrate and a second portion of the dielectric layer is formed to overlie the first portion of the dielectric layer. The maximum doping concentration of the doping atoms introduced into the tunnel region is displaced away from the principal surface.

In yet another aspect of the invention, a process for fabricating an EEPROM device includes providing a semiconductor substrate having a principal surface and forming a first doping concentration of a conductivity-determining doping in a tunnel region of the substrate. Then, a second doping concentration distribution of the conductivity-determining doping is formed in the tunnel region. The process is carried out in such a way that the maximum doping concentration of the second doping concentration distribution is displayed away from the principal surface.

In a still further aspect of the invention, an EEPROM device includes a semiconductor substrate having a principal surface and a dielectric layer on the principal surface. A program junction region resides in the semiconductor substrate adjacent to the dielectric layer. The program junction region is characterized by a doping concentration profile in which the maximum doping concentration is displaced away from the principal surface.

Figure 1:
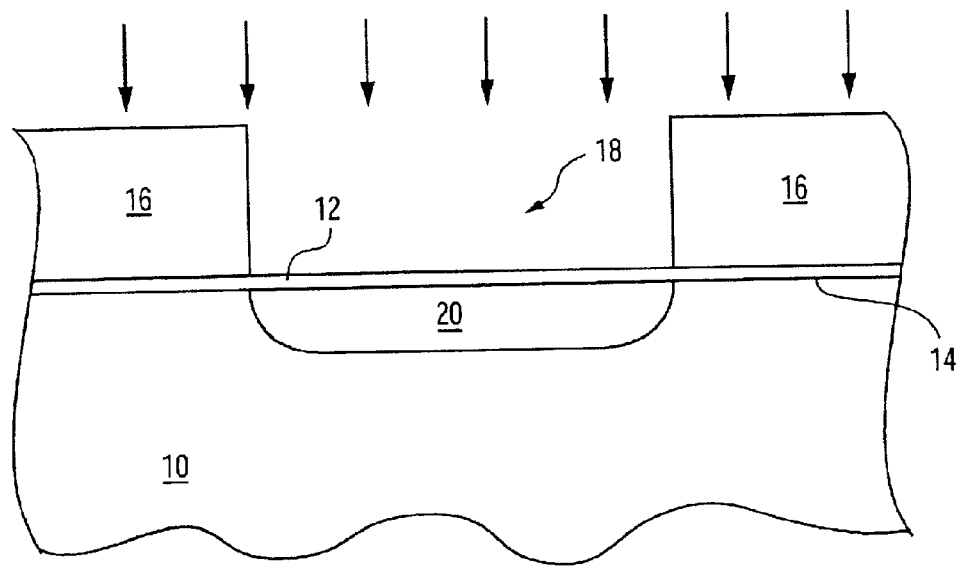
FIGS. 1–2 illustrate, in cross-section, processing steps in accordance with one embodiment of the invention.

It will be appreciated that for simplicity and clarity of illustration, elements shown in the FIGURES have not necessarily been drawn to scale. For example, the dimensions of some of the elements are exaggerated relative to others for clarity. Further, where considered appropriate, reference numerals have been repeated among the FIGURES to indicate corresponding elements.

DETAILED DESCRIPTION

Shown in FIG. 1, in cross-section, is a portion of a semiconductor substrate 10 having already undergone several processing steps in accordance with one embodiment of the invention. A first tunnel dielectric layer 12 overlies a principal surface 14 of semiconductor substrate 10. A lithographic mask 16 overlies first tunnel dielectric layer 12 and has an opening 18 that exposes a portion of the dielectric layer. Opening 18 further defines a program junction region 20 in semiconductor substrate 10 immediately below the dielectric layer 12.

Doping atoms are introduced into semiconductor substrate 10 using lithographic mask 16 as a doping mask. In accordance with a preferred embodiment of the invention, conductivity-determining doping atoms are ion implanted into semiconductor substrate 10. The implanted ions penetrate first tunnel dielectric portion 12 and travel into semiconductor substrate 10 to form a doping distribution within program junction region 20. The depth of penetration into semiconductor substrate 10 depends upon several factors including, the implantation energy, the particular ionic species that is implanted, the particular semiconductor material from which semiconductor substrate 10 is formed, the particular dielectric material from which first tunnel dielectric layer 12 is formed, the thickness of first dielectric layer 12, and the like.

Those skilled in the art will appreciate that depending upon the particular type of EEPROM device being fabricated, semiconductor substrate 10 can have a P-type or N-type conductivity. Further, depending upon the conductivity of the transistors to be fabricated in the EEPROM device, the doping atoms introduced into program junction region 20 can be either N-type or P-type: For the purpose of illustration, the process of the invention will be described with respect to a P-type substrate and N-type dopants. Those skilled in the art will, however, appreciate that the conductivity of the described materials and dopants can be reversed. In accordance with the preferred embodiment of the invention, semiconductor substrate 10 is a P-type substrate, and doping atoms introduced into program junction region 20 are N-type dopants, such as phosphorous, arsenic, and the like.

Although a variety of dielectric materials, such as silicon nitride, silicon oxynitride, low-k dielectric materials, and the like, can be used, preferably, first tunnel dielectric layer 12 is silicon dioxide. The silicon dioxide is formed by thermally oxidizing principal surface 14 of semiconductor substrate 10. In a preferred embodiment of the invention, a thermal oxidation process is carried out to form first tunnel dielectric portion 12 to a thickness of about 60 angstroms to about 100 angstroms. Further, preferably, phosphorous ions are implanted into program junction region 20 using an ion implantation dose of about 1E13 ions/cm$^2$ to about 1E15 ions/cm$^2$.

Figure 2:
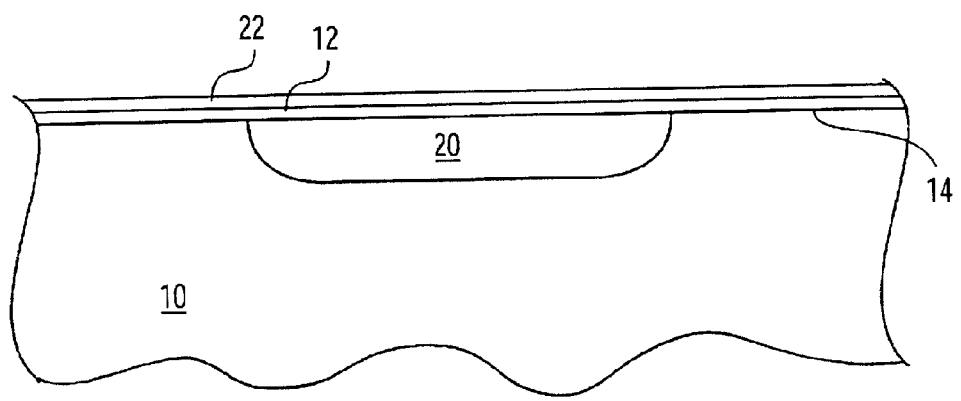

After introducing conductivity-determining doping ions into program junction region 20, a second tunnel dielectric layer 22 is formed to overlie first tunnel dielectric layer 12, as illustrated in FIG. 2. Preferably second tunnel dielectric layer 22 is formed to a thickness of about 25 angstroms to about 50 angstroms using a thermal oxidation process. In one embodiment of the invention, an oxidation process is carried out at a temperature of about 700° C. to about 1000° C. Second tunnel dielectric layer 22 also acts as a gate dielectric layer for low voltage transistors (not shown) that are fabricated concurrently with the tunnel capacitor.

Figure 3:
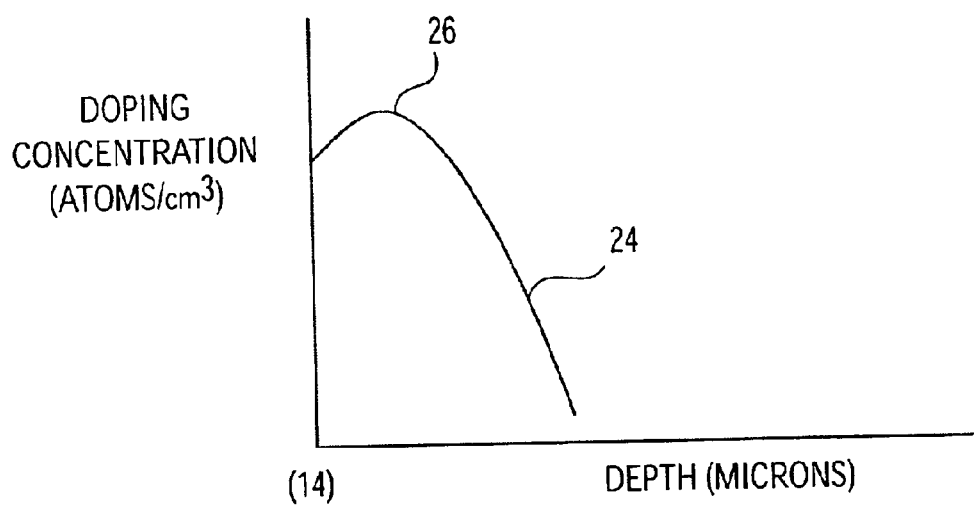
FIG. 3 is a plot of concentration versus depth illustrating a doping profile of the program junction region formed in accordance with one embodiment of the invention.

The thermal process carried out to form second tunnel dielectric layer 22 also functions to diffuse doping atoms in the program junction 20, which somewhat flattens the initial doping profile. As illustrated in the plot of FIG. 3, a doping distribution profile 24 has a maximum doping concentration at a point 26 corresponding to a doping maxima of doping distribution profile 24. The origin of the plot shown in FIG. 3 corresponds to principal surface 14. As illustrated in FIG. 3, the maximum doping concentration is displaced away from principal surface 14.

Those skilled in the art will appreciate that a variety of thermal processing techniques can be used to fabricate first and second tunnel dielectric layers 12 and 22. For example, the tunnel dielectric layers can be formed by a convective thermal oxidation process, a rapid thermal annealing (RTA) process, and the like.

Figure 4:
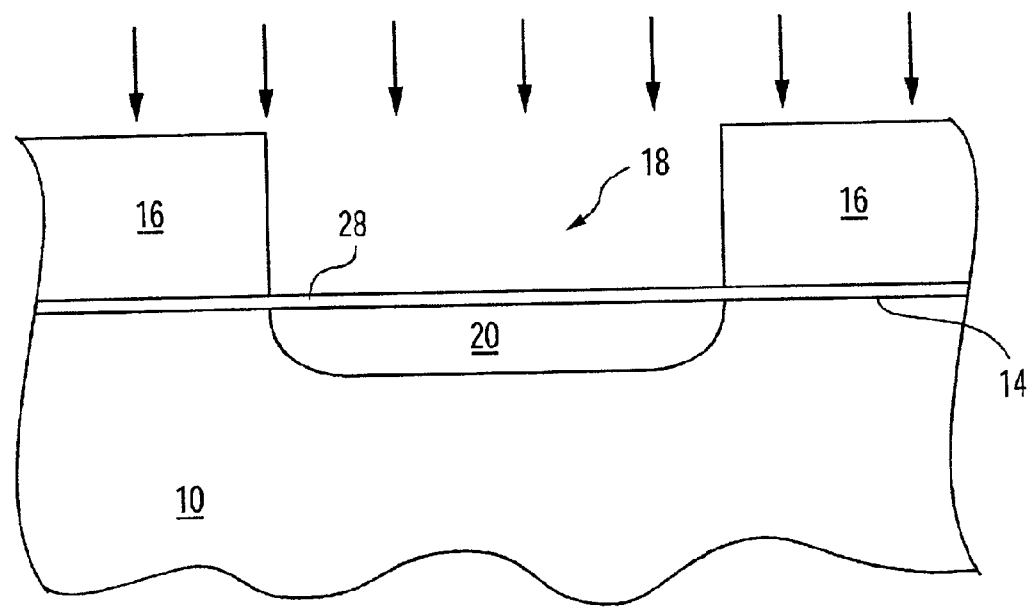
FIG. 4 illustrates, in cross-section, a processing step carried out in accordance with a further embodiment of the invention.

A process in accordance with another embodiment of the invention is illustrated in FIG. 4. The structure illustrated in FIG. 4 is substantially the same as that illustrated in FIG. 1, where a lithographic mask 16 overlies semiconductor substrate 10 and define program junction region 20. In accordance with the embodiment illustrated in FIG. 4 a tunnel dielectric layer 28 overlies principal surface 14 of semiconductor substrate 10. Once lithographic pattern 16 is formed, a first doping process is carried out to dope program junction region 20 through opening 18 in lithographic mask 16. The dopant atoms penetrate regions of tunnel dielectric layer 28 exposed by opening 18.

In the embodiment of the invention illustrated in FIG. 4, the doping atoms can be selected from species that will impart either an N-type conductivity or a P-type conductivity to program junction region 20. As described above, those skilled in the art will recognize that the conductivity of the dopant atoms will depend upon the conductivity of semiconductor substrate 10 and the particular conductivity of the transistors employed in the EEPROM memory device. In a preferred embodiment, the doping atoms are N-type and can be either arsenic or phosphorous.

Figure 5:
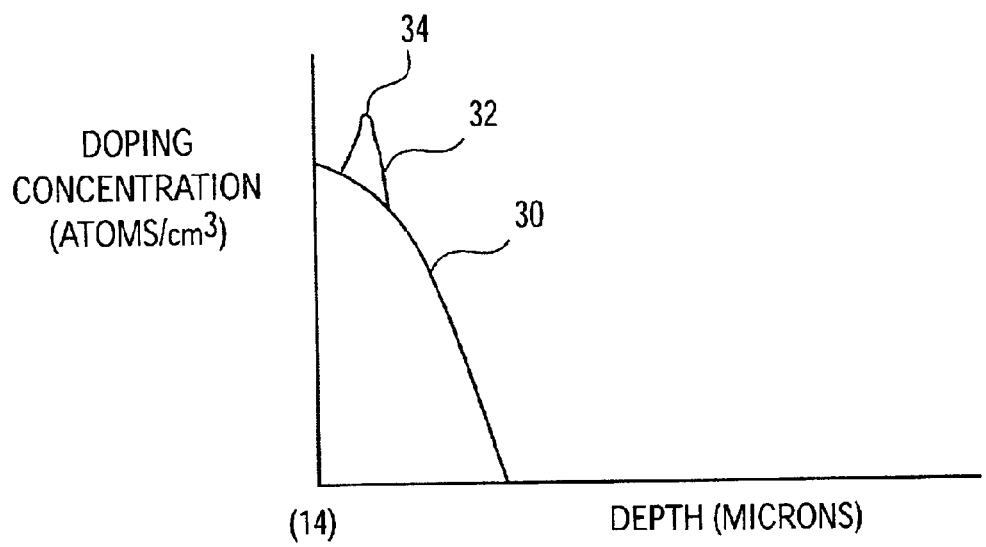
FIG. 5 is a plot of concentration versus depth illustrating a doping profile in the program junction region formed in accordance with yet another embodiment of the invention.

FIG. 5 illustrates a plot of doping concentration versus depth within program junction region 20. The previously described doping process forms a first doping concentration distribution 30. As illustrated in FIG. 5, doping concentration distribution 30 exhibits a maxima at principal surface 14, and steadily decreases with increasing depth in program junction region 20.

In accordance with the invention, a second doping process is carried out using the structure of FIG. 4, with the lithographic mask 16 again as a doping mask. The second doping process forms a second doping concentration distribution 32 in the program junction region 20. Second doping concentration distribution 32 has a maxima 34 that is displaced away from principal surface 14. In accordance with the invention, the second doping process is preferably carried out by implantation using an implant energy that differs from the implant energy used to create first doping concentration distribution 30. In particular, where second doping concentration distribution 32 is formed by implanting the same doping species as used to form first doping concentration distribution 30, a greater ion implant energy is used, such that the peak doping concentration of the second doping step resides at a predetermined distance away from principal surface 14.

Those skilled in the art will recognize that the doping profile illustrated in FIG. 5 can also be created by using different single ion and molecular ion species to form first doping concentration distribution 30 and second doping concentration distribution 32. Further, the relative ion implant energy used for each doping process will depend upon the particular species implanted and can further vary depending upon the particular ionic charge of the implanted species. For example, doubly charged ionic species attain roughly twice the acceleration energy of a singly charged species at the same ion implantation acceleration energy.

Figure 6:
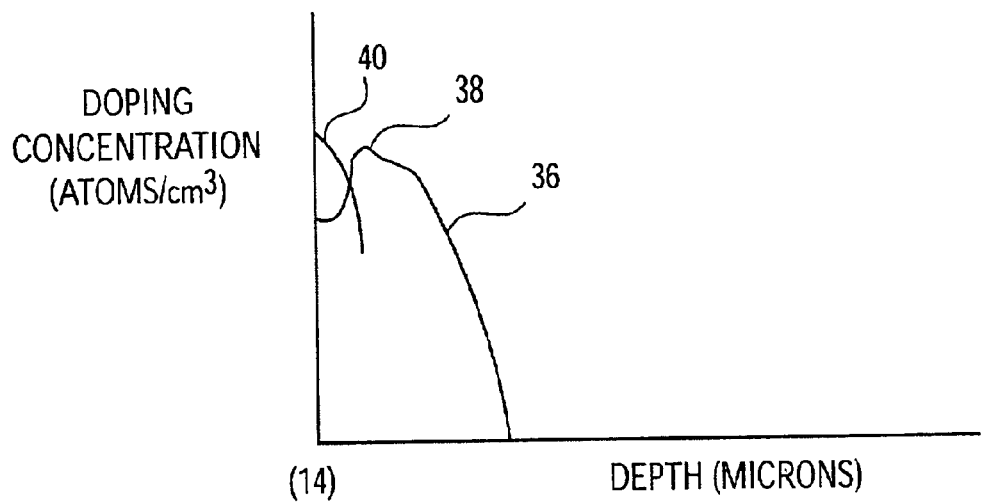
FIG. 6 is a plot of doping concentration versus depth illustrating a doping concentration profile in the program junction region in accordance with a still further embodiment of the invention.

In yet another embodiment of the invention, a doping process is carried out with the structure illustrated in FIG. 4 to form a first doping concentration distribution 36, shown in FIG. 6. First doping concentration distribution 36 has a doping maxima 38 that is displaced away from principal surface 14 by counter doping program junction region 20 with a dopant of opposite conductivity type. As illustrated in FIG. 6, a second doping concentration distribution 40 has a maximum concentration at principal surface 14 and the doping concentration decreases with depth into program junction region 20. Through the interaction of doping atoms of opposite conductivity type, the doping maxima 38 resides at a distance into program junction region 20, rather that at principal surface 14.

In a preferred embodiment of the invention, the first doping process is carried out by ion implantation of an N-type doping, and the second doping process is carried out by ion implantation of a P-type doping. In particular, phosphorous can be used as the N-type doping and boron can be used as the P-type doping. Those skilled in the art will recognize that other combinations of doping species having opposite conductivity types are possible. Further, those skilled in the art will appreciate that although the present invention is described with respect to silicon substrates, that other types of substrates can be doped with different species than previously described. For example, III–V semiconductor materials are doped with atoms other than arsenic, phosphorous, and boron.

Figure 7:
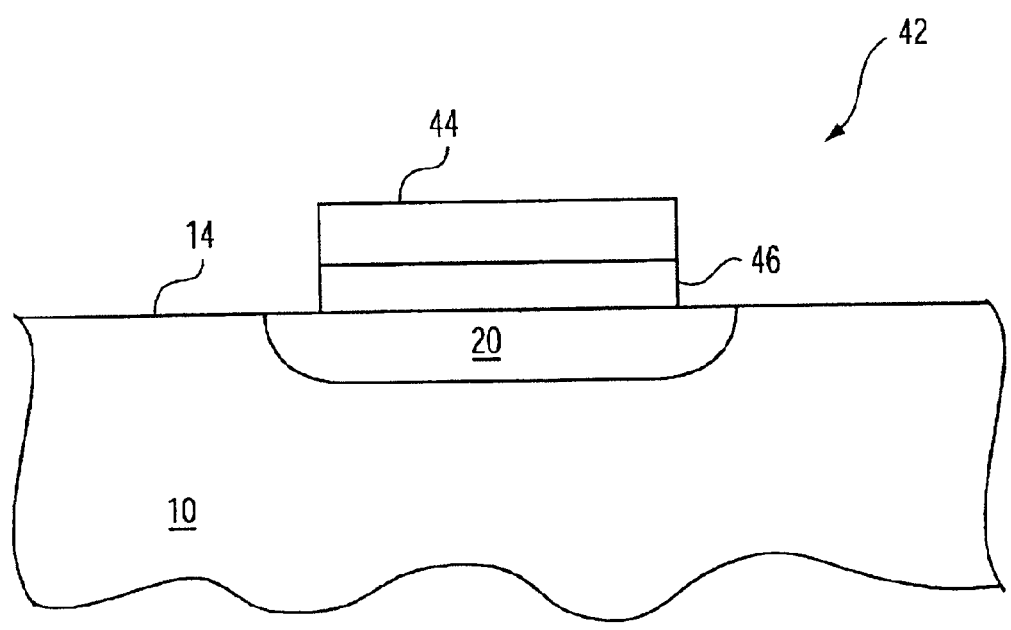
FIG. 7 illustrates, in cross-section, a tunnel capacitor of an EEPROM device formed in accordance with the invention.

The inventive process continues with the formation of a floating-gate capacitor 42, as illustrated in FIG. 7. A floating gate layer 44 overlies program junction region 20 and is separated therefrom by a tunnel dielectric layer 46. Channel dielectric layer 46 can be either a composite tunnel dielectric layer, as previously described and illustrated in FIG. 2, or alternatively, tunnel dielectric layer 46 can be the same as tunnel dielectric layer 28, previously described and illustrated in FIG. 4. Those skilled in the art will appreciate that floating gate layer 44 can be formed from a variety of conductive materials. In a preferred embodiment of the invention, floating gate layer 44 is formed by deposition and etching of a polycrystalline silicon layer. Alternatively, floating gate layer 44 can be another conductive or semiconductive material, such as a refractory metal silicide, amorphous silicon, a refractory metal layer, and the like.

In accordance with the invention, floating gate capacitor 42 exhibits high programming efficiency as a result of the relatively low surface doping concentration in program junction region 20. Further, the large capacitance of floating gate capacitor 42 enables a high capacitive coupling ratio attainable during an erase operation. Also, the relatively high doping concentration that is obtained at a specified depth away from principal surface 14 in program junction region 20 avoids the creation of a large depletion layer during programming. Accordingly, the program junction region threshold voltage will not be excessively high.

Figure 8A:
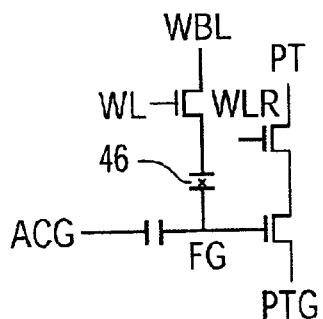
FIGS. 8A and 8B illustrate schematic diagrams of three-transistor EEPROM memory cells incorporating a program junction region fabricated in accordance with the invention.
Figure 8B:
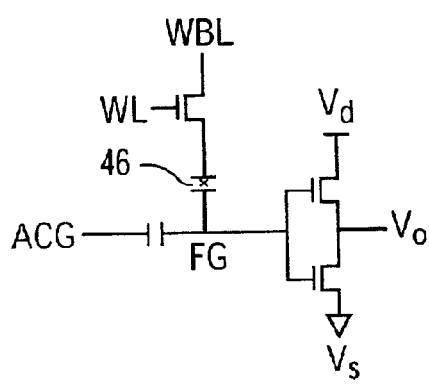

The process of the invention can be used to fabricate a wide variety of EEPROM memory devices, including two-transistor EEPROM devices and three-transistor EEPROM devices. FIGS. 8A and 8B illustrate two of many different possible configurations for a three-transistor EEPROM device. As illustrated in the schematic circuit diagrams of FIGS. 8A and 8B, floating gate capacitor 46 capacitively couples the source of the word line transistor to the floating gate layer 44 (designated as FG). For reference purposes, the symbol "ACG" designates a control gate region. Further, the symbols "WL" represent a word line, "WBL" represent a write bit line, "WLR" represents a read word line, "PT" represent a product term, "PTG" represent a product term ground, "$V_d$" and "$V_s$" are supply voltages, and "$V_0$" is an output node voltage. The transistor activated by WLR is one of the low voltage transistors described above in which the gate dielectric layer is formed by second tunnel dielectric layer 22.

Figure 9A:
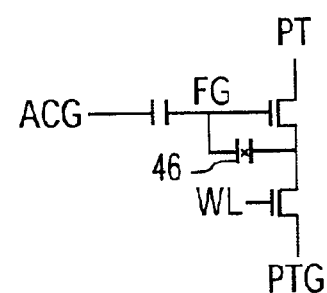
FIGS. 9A and 9B illustrate schematic diagrams of two-transistor EEPROM memory cells incorporating a program junction region fabricated in accordance with the invention.
Figure 9B:
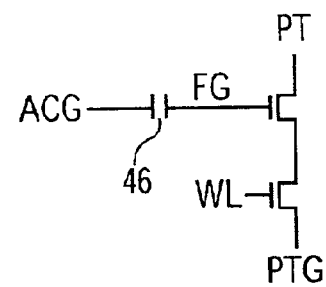

In addition to three-transistor EEPROM devices, the process of the invention can be employed to fabricate a floating gate capacitor in a two-transistor EEPROM device. FIGS. 9A and 9B illustrate schematic diagrams of two-transistor EEPROM devices. As illustrated in the diagram of FIG. 9A, floating gate capacitor 46 capacitively couples a floating gate layer to the source of a word line transistor. In FIG. 9B, floating gate electrode 46 capacitively couples an array control gate (ACG) to floating gate layer 44 (designated FG). The remaining symbols appearing in FIGS. 9A and 9B represent the same components as described above.

Thus it is apparent that there has been described in accordance with the invention a process for fabricating an EEPROM device having a retrograde program junction region that fully provides the advantages set forth above. Those skilled in the art will appreciate that variations and modifications can be made from the process described above without departing from the spirit and scope of the invention. For example, various molecular beam ion implantation techniques can be used. Additionally, advanced anisotropic etching processes, such as electron-cyclotron-resonant (ECR) etching processes can be used. Accordingly, all such variations and modifications are intended to be included within the scope of the appended claims and equivalents thereof.

What is claimed is:

1. A process for fabricating an EEPROM device comprising:
   providing a semiconductor substrate having a principal surface; forming a tunnel dielectric layer on the principal surface; and
   forming a program junction region in the semiconductor substrate by introducing a dopant through the tunnel dielectric layer to create a doping concentration profile in the program junction region,
   wherein a maximum doping concentration is displaced away from the principal surface.

2. The process of claim 1, wherein forming a program junction region comprises:
   forming a first tunnel dielectric layer on the principal surface;
   introducing a dopant through the first tunnel dielectric layer; and
   forming a second tunnel dielectric layer on the first dielectric layer.

3. The process of claim 2, wherein forming the second tunnel dielectric layer further comprises forming the gate dielectric layer for a low voltage transistor.

4. The process of claim 3, wherein forming a program junction region comprises forming a program junction region in a single-poly EEPROM device selected from the group consisting of a two-transistor device and a three-transistor device.

5. The process of claim 3, wherein forming the second tunnel dielectric layer comprises a thermal oxidation process.

6. The process of claim 1, wherein forming a program junction region comprises implanting dopant atoms into the substrate at a first implant energy and implanting dopant atoms into the substrate at a second implant energy, wherein the first implant energy differs from the second implant energy.

7. The process of claim 1, wherein forming a program junction region comprises implanting dopant atoms of a first conductivity type into the substrate and implanting dopant atoms of a second conductivity type into the substrate, wherein dopant atoms of the second conductivity type have a maximum concentration at the principal surface.

8. The process of claim 7, wherein the first conductivity type is N-type and the second conductivity type is P-type.

9. The process of claim 1, wherein the doping concentration profile comprises a parabolic cross-sectional profile, wherein the maximum doping concentration is flanked by regions of low doping concentration.

10. A process for fabricating a program junction region in an EEPROM device, the process comprising:
    providing a semiconductor substrate having a principal surface;
    forming a first tunnel dielectric layer overlying the principal surface;
    introducing dopant atoms into a program junction region of the substrate; and
    forming a second tunnel dielectric layer overlying the first tunnel dielectric layer, wherein a maximum doping concentration in the program junction region is displaced away from the principal surface.

11. The process of claim 10, wherein forming the second tunnel dielectric layer further comprises forming the gate dielectric layer for a low voltage transistor.

12. The process of claim 11, wherein forming a second tunnel dielectric layer comprises a thermal oxidation process.

13. The process of claim 11, wherein introducing dopant atoms into the tunnel region comprises ion implantation of a conductivity determining dopant through the first tunnel dielectric layer.

14. The process of claim 13, wherein providing a semiconductor substrate comprises providing a p-type substrate, and wherein ion implantation of a conductivity determining dopant comprises ion implantation of an n-type dopant.

15. The process of claim 10, wherein forming a first tunnel dielectric layer and forming a second tunnel dielectric layer comprises thermal oxidation, and wherein the first tunnel dielectric layer is formed to a thickness of about 60 angstroms to about 100 angstroms.

16. The process of claim 15, wherein introducing dopant atoms comprises ion implanting about 1 E 13 ions/cm' to about 1 E 15 ions/cm2 of an n-type dopant.

17. A process for fabricating an EEPROM device comprising:
    providing a semiconductor substrate having a principal surface;
    forming a first doping concentration distribution of a conductivity determining dopant in a program junction region of the substrate; and
    forming a second doping concentration distribution of the conductivity determining dopant in the tunnel program function region,
    wherein a maximum doping concentration of the second doping concentration distribution is displaced away from the principal surface.

18. The process of claim 17 further comprising forming a dielectric layer overlying the tunnel region and forming a floating-gate layer overlying the dielectric layer.

19. The process of claim 18, wherein forming a floating-gate layer comprises forming a floating-gate layer for a three transistor, single-poly EEPROM device.

20. The process of claim 18, wherein forming a floating-gate layer comprises forming a floating-gate layer for a two-transistor, single-poly EEPROM device.

* * * * *

UNITED STATES PATENT AND TRADEMARK OFFICE
CERTIFICATE OF CORRECTION

PATENT NO.    : 6,716,705 B1
DATED         : April 6, 2004
INVENTOR(S)   : Mehta et al.

It is certified that error appears in the above-identified patent and that said Letters Patent is hereby corrected as shown below:

Column 8,
Lines 47-48, "dopant in the tunnel program function region" should be -- dopant in the program junction region --.

Signed and Sealed this

Twelfth Day of October, 2004

JON W. DUDAS
*Director of the United States Patent and Trademark Office*